(12) United States Patent
Wong et al.

(10) Patent No.: US 10,446,735 B2
(45) Date of Patent: Oct. 15, 2019

(54) TECHNIQUES FOR TRANSFERRING THERMAL ENERGY STORED IN PHASE CHANGE MATERIAL

(71) Applicant: INTEL CORPORATION, Santa Clara, CA (US)

(72) Inventors: Hong W. Wong, Portland, OR (US); Wah Yiu Kwong, Hillsboro, OR (US); Shaorong Zhou, Shanghai (CN); Xiaoguo Liang, Shanghai (CN); Cheong W. Wong, Beaverton, OR (US); Yanbing Sun, Shanghai (CN)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/553,372

(22) PCT Filed: Mar. 27, 2015

(86) PCT No.: PCT/CN2015/075199
§ 371 (c)(1),
(2) Date: Aug. 24, 2017

(87) PCT Pub. No.: WO2016/154784
PCT Pub. Date: Oct. 6, 2016

(65) Prior Publication Data
US 2018/0138387 A1    May 17, 2018

(51) Int. Cl.
*H01L 37/02* (2006.01)
*F28D 20/02* (2006.01)
(Continued)

(52) U.S. Cl.
CPC .............. *H01L 37/02* (2013.01); *F28D 20/02* (2013.01); *F28D 20/028* (2013.01);
(Continued)

(58) Field of Classification Search
CPC ..... H01L 37/02; H01L 23/4275; H01L 35/32; F28D 20/02; F28D 20/028
(Continued)

(56) References Cited

U.S. PATENT DOCUMENTS 5,597,976 A * 1/1997 Schroeder ............... H01L 35/00
136/205
2004/0238022 A1 12/2004 Hiller et al.
(Continued)

FOREIGN PATENT DOCUMENTS

| CN | 103527955 A | 1/2014 |
| EP | 0389407 A1 | 9/1990 |

(Continued)

OTHER PUBLICATIONS

International Search Report received for PCT Patent Application No. PCT/CN2015/075199, dated Dec. 11, 2015, 4 pages.
(Continued)

*Primary Examiner* — Jayne L Mershon

(57) ABSTRACT

Various embodiments are generally directed to an apparatus, method and other techniques to receive thermal energy from a source, convert phase change material (102) from an initial state to a secondary state in response to absorption of the thermal energy, and transfer the thermal energy from the phase change material (102) to a thermoelectric component (106). In addition, various embodiments may include collecting, conducting and converting the thermal energy into electrical energy for use in powering one or more electronic components.

23 Claims, 10 Drawing Sheets

(51) Int. Cl.
  *H01L 23/427* (2006.01)
  *H01L 35/32* (2006.01)
  *H05K 3/28* (2006.01)
  *F28D 15/02* (2006.01)
  *F28D 21/00* (2006.01)
  *F28F 13/00* (2006.01)

(52) U.S. Cl.
  CPC .......... *H01L 23/4275* (2013.01); *H01L 35/32* (2013.01); *F28D 15/02* (2013.01); *F28D 2021/0028* (2013.01); *F28F 2013/006* (2013.01); *H05K 3/284* (2013.01); *Y02E 60/145* (2013.01)

(58) Field of Classification Search
  USPC .......................................................... 136/201
  See application file for complete search history.

(56) References Cited

U.S. PATENT DOCUMENTS

| | | |
|---|---|---|
| 2010/0050658 A1 | 3/2010 | Ali |
| 2011/0083436 A1 | 4/2011 | White et al. |
| 2013/0169078 A1 | 7/2013 | Rodriguez et al. |
| 2014/0209141 A1* | 7/2014 | Fornara .................. H01L 27/16 136/205 |
| 2014/0230868 A1* | 8/2014 | Ryu ........................ H01L 35/22 136/200 |
| 2014/0247557 A1* | 9/2014 | Qiu .......................... H01L 23/46 361/700 |
| 2014/0299169 A1* | 10/2014 | Schneider ............... H01L 35/02 136/201 |
| 2014/0305927 A1* | 10/2014 | Alexander ........... A47G 19/027 219/387 |
| 2015/0013738 A1* | 1/2015 | Lu .......................... H01L 35/30 136/201 |

FOREIGN PATENT DOCUMENTS

| | | |
|---|---|---|
| EP | 1001470 A1 | 5/2000 |
| JP | 2003339180 A | 11/2003 |
| JP | 2012190940 A | 10/2012 |
| JP | 201378202 A | 4/2013 |
| JP | 201380800 A | 5/2013 |
| JP | 2013531458 A | 8/2013 |
| JP | 2014504167 A | 2/2014 |
| WO | 2011008280 A1 | 1/2011 |

OTHER PUBLICATIONS

European Search Report and Written Opinion for the European Patent Application No. EP15886771, dated Oct. 4, 2018, 6 pages.

* cited by examiner

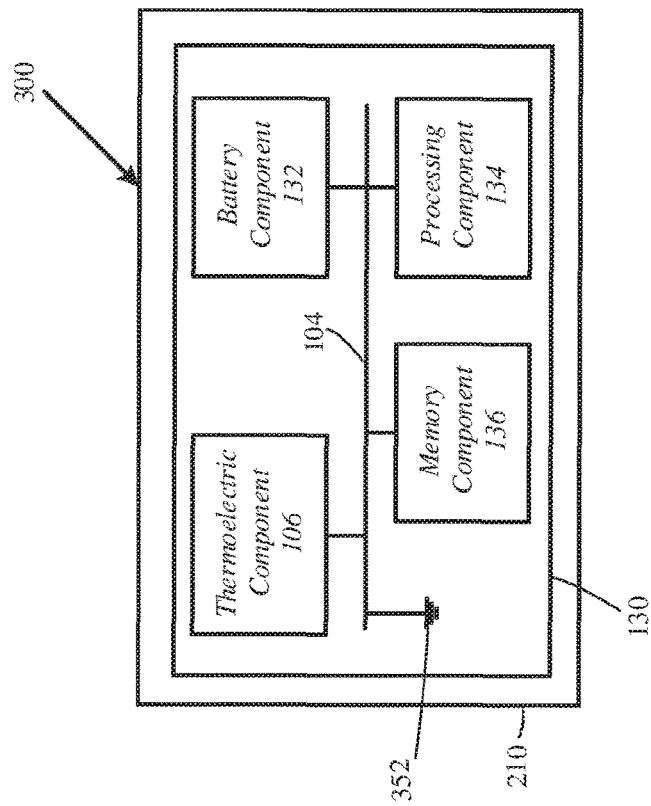
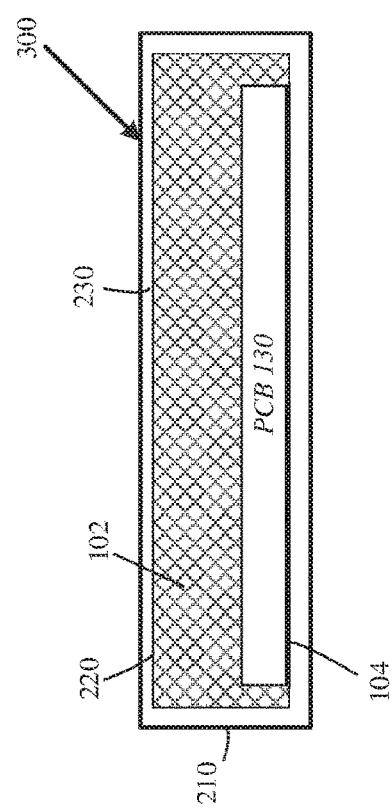
FIG. 3B
FIG. 3A

TECHNIQUES FOR TRANSFERRING THERMAL ENERGY STORED IN PHASE CHANGE MATERIAL

CROSS-REFERENCE TO RELATED APPLICATIONS

This application is a national phase claiming the benefit of and priority to International Patent Application No. PCT/CN2015/075199, entitled "TECHNIQUES FOR TRANSFERRING THERMAL ENERGY STORED IN PHASE CHANGE MATERIAL," filed Mar. 27, 2015, which is hereby incorporated by reference in its entirety.

TECHNICAL FIELD

Embodiments described herein generally relate techniques to absorb and transfer thermal energy stored in phase change material.

BACKGROUND

Recently, wearable devices and other small form factor devices have begun to offer functionality beyond what they were originally designed to provide. For example, wearable devices such as watches now can provide caller ID functionality, fitness tracking functionality, notification functionality, and so forth. Thus, these devices have an increased need for processing capabilities, storage and power while having limited internal volume and irregular shapes to store components.

BRIEF DESCRIPTION OF THE DRAWINGS

FIG. 3A illustrates a cross sectional view example embodiment of an enclosure for phase change material and a printed circuit board.

FIG. 3B illustrates a top down view of an example embodiment of an enclosure for phase change material and a printed circuit board.

DETAILED DESCRIPTION

Figure 1A:
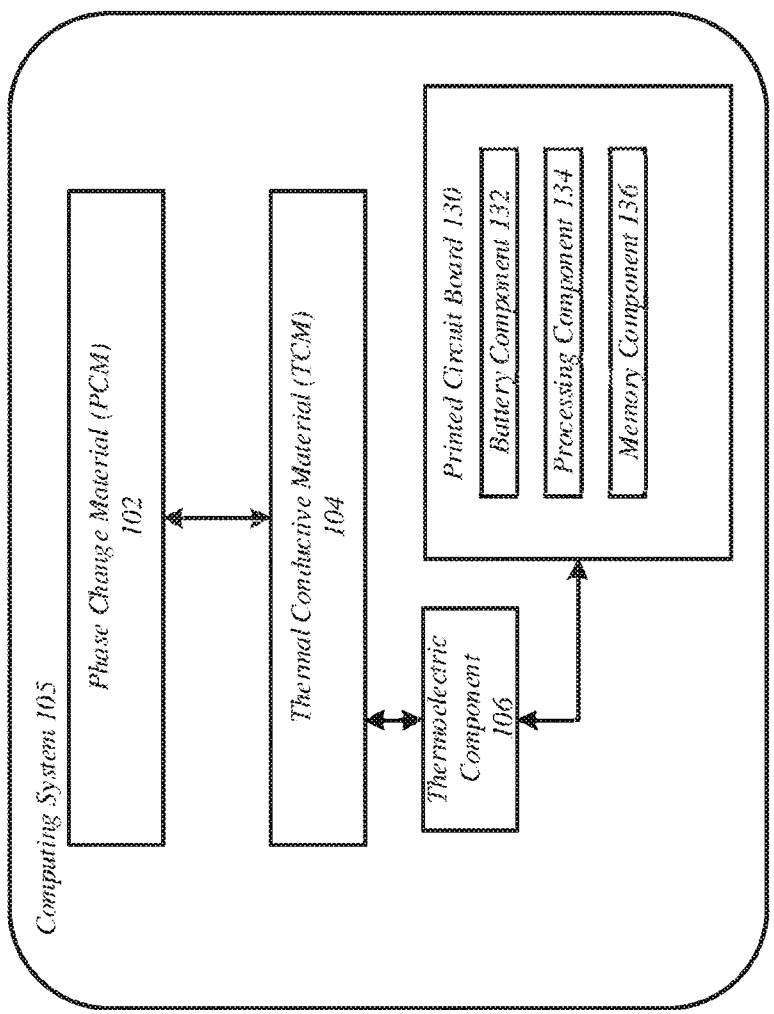
FIG. 1A illustrates an example embodiment of a computing system.

Various embodiments are directed to systems, devices, methods and techniques to absorb thermal energy by a phase change material and transfer the thermal energy to a thermoelectric component for conversion into electrically energy. More specifically, various embodiments include storing phase change material in an enclosure that is capable of receiving and storing thermal energy from a source, such as a hot liquid, a body part, an electronic component, ambient air temperature, and so forth. Upon absorbing the thermal energy, the phase change material may change from a first phase to a second phase to store the thermal energy. For example, the phase change material may change from a solid state to a liquid state or from a liquid state to a gaseous state.

In some embodiments, the thermal energy stored in the phase change material may be transferred via a thermal conductive material to a thermoelectric component. For example, at least a portion of the phase change material may be thermally and/or physical coupled with a thermal conductive material which may also be coupled with a thermoelectric component. The thermal energy may then be transferred or conducted to the thermoelectric component via thermal conductive material.

The thermoelectric component may receive the thermal energy and convert the thermal energy to electrical energy. The electrical energy may be used to power one or more components and perform work. In some embodiments, the thermoelectric component may provide the electrical energy directly to one or more components via one or more interconnects. In another example, the thermoelectric component may provide the electrical energy to a battery for storage. In a third example, the electrical energy may be provided to one or more induction coils and may be transferred to another device for power and/or storage. Various embodiments are not limited in this manner and these and other details are discussed below in the following description.

Various embodiments also relate to an apparatus or systems for performing these operations. This apparatus may be specially constructed for the required purpose or it may include a general-purpose computer as selectively activated or reconfigured by a computer program stored in the computer. The procedures presented herein are not inherently related to a particular computer or other apparatus. Various general-purpose machines may be used with programs written in accordance with the teachings herein, or it may prove convenient to construct more specialized apparatus to perform the required method. The required structure for a variety of these machines will appear from the description given.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives consistent with the claimed subject matter.

FIG. 1A illustrates an exemplary embodiment of a computing system 105 in which aspect of the present disclosure may be employed. Computing system 105 may include any number of components for processing information and data. The computing system 105 may also include phase change material 102 for absorbing thermal energy from a source, and thermal conductive material 104 for transferring the thermal energy from the phase change material 102 and a thermoelectric component 106.

In some embodiments, the computing system 105 may be any type of computing device, mobile computing device, laptop computing device, personal computing device, or any other type of computing device that may process data and information. In some embodiments, computing system 105 may be a wearable computing device including a watch, eye glasses, a pendent, a necklace, jewelry, a hat, a smart band, headphones, earbuds, or any other type of wearable device. Various embodiments are not limited in this manner and computing system 105 may be any type of device.

The computing system 105 may include the phase change material 102 which may be any material that is capable of storing and releasing thermal energy. For example, the phase change material 102 may be an organic phase change material such as paraffin or a fatty acid, or inorganic phase change material such as salt hydrates. In some embodiments, the phase change material 102 may be a eutectic or a hygroscopic material such as water. Various embodiments are not limited to the above-recited phase change materials.

The phase change material 102 may receive heat generated by a source, such as one or more electronic components, one or more human body parts, any type of substance including coffee, tea, or any other type of liquid or substance. The phase change material 102 may absorb the thermal energy generated by the source and store it within molecules while the phase change material reaches a melting temperature, i.e., a phase change temperature.

For example and in some embodiments, the phase change material 102 may change from a first or initial state of matter to a second or final state of matter upon absorption of thermal energy, e.g. heat. Moreover, the phase change material 102 may change from a solid state to a liquid state, or from a liquid state to a gaseous state upon absorption of the heat.

Further, the phase change material 102 may also release thermal energy stored and may return to the first or initial state from the second or final state. For example, upon cooling the phase change material 102 may change from a liquid state to a solid state or from a gaseous state to a liquid state. Various embodiments are not limited in this manner.

Typically, the phase change material 102 used may be selected based on environmental operating conditions, including a temperature range of the thermal energy source. For example, the phase change material 102 may be selected such that it changes from a solid at room temperature (e.g., ~20° C. or ~68° F.) to a liquid state at a temperature near or below a human's body temperature (e.g., ~37° C. or ~98° F.) or normal skin temperature (e.g., between ~0.33.5° C. and 36° C. or between ~92.3° F. and 98.4° F.). In this example, the phase change material 102 may be part of a wearable device such as a wrist watch band and may absorb thermal energy generated by the human body or wrist and change from a solid state to a liquid state at a temperature lower than the human body temperature.

In another example, the phase change material 102 may be selected such that it is in a solid state at room temperature and changes to a liquid state at a temperature near and below a normal operating state of an electronic component, as defined by the electronic components specifications. In this example, the phase change material 102 may be in a housing and surround one or more electronic components. Moreover, in this example, the phase change material 102 may also be chosen such that it is not corrosive to the one or more electronic components.

In a third example, the phase change material 102 may be selected such that it is in a solid state at room temperature and changes to a liquid state at a temperature near and below a normal temperature of a hot beverage (e.g. between 70° C. or 160° F. and 85° C. or 185° F.). In this example, the phase change material 102 may be part of a mug or cup for drinking hot beverages.

Various embodiments are not limited to the above-recited examples and when selecting a phase change material 102 other environment factors may be used. For example, a phase change material 102 may be selected based on its ability to store thermal energy, heat of fusion characteristics, melting point, freezing point, specific heat characteristics, density, thermal conductivity, volumetric heat capacity characteristics, thermal effusivity, number of change cycles, weight and cost. The low range melting temperature phase change material (30-50° C.) is a good candidate for the consumer mobile devices, for example The computing system 105 may also include a thermal conductive material 104 which may be coupled with the phase change material 102 and a thermoelectric component 106. The thermal conductive material 104 may be any type of material capable of transferring thermal energy from the phase change material 102 to the thermoelectric component 106. For example, the thermal conductive material 104 may be a metal (150-400 W/[m/K] (a-b plane), such as silver, aluminum, gold, copper, iron, molybdenum, lead, platinum, tungsten, and so forth. Moreover, the thermal conductive material 104 may be a metal such as copper used as one or more traces to interconnect one or more electronic components on a printed circuit board, e.g. a ground plane. In certain applications, such as when the thermal conducting path is effected on the component substrate or Printed Circuit Board, high thermal conductivity and low coefficient of thermal expansion property (0-6 ppm/C) are needed on the substrates and the package; and therefore, copper-matrix composites with low thermal expansion fillers (example carbon fibers, carbon composite laminate or molybdenum particles) can be used.

Further and in another example, the thermal conductive material 104 may be a bendable or pliable material, such as a graphite sheet or a silicon rubber that has good thermal conductivity, e.g. ~2 Watts/meter*Kelvin and may be used as part of a watch band. However, various embodiments are not limited in this manner and the thermal conductive material 104 may be any other type of material that is capable of transferring energy from the phase change material 102 to the thermometric component 106.

In various embodiments, the thermal conductive material 104 may be coupled with or connected to the phase change material 102 such that it may absorb thermal energy stored in the phase change material 102. For example, the thermal conductive material 104 may include one or more surfaces which may be in physical and/or thermal contact with the phase change material 102 to absorb the thermal energy. In some embodiments, the thermal conductive material 104 may couple or contact the phase change material 102 on one end and couple or contact the thermoelectric component 106 on a other end such that the thermal energy is transferred from the phase change material 102 to the thermoelectric component 106. In some embodiments, the thermal conductive material 104 may be surrounded by the phase change material 102 and one or more ends or surfaces may also couple or contact the thermoelectric component 106 such that the thermal energy is transferred. Various embodiments are not limited in this manner.

In the same or other embodiments, the thermal conductive material 104 may be a micro-heat pipe or heat sink. Typically, a micro-heat pipe may be a small metal pipe with capillary structure on an inner wall. The micro-heat pipe may be a vacuum inside with a small quantity of fluid. In embodiments, the micro-heat pipe may be couple with or connect to the phase change material 102 and when the phase change material 102 absorbs thermal energy (heat) the micro-heat pipe may transfer the thermal energy to a coupled thermoelectric component 106. The phase change material can be encapsulated within the void of the device, such as the frame of the "smart eye glass". One end of the micro-heat pipe can be terminated in that space and the other end of the heat pipe can conduct the thermal energy to the thermoelectric component 106 located at the far end of the device. In other implementation example, the phase change material can encapsulate the electronic circuitry, which also act as the thermal conductive material and path to transfer the thermal energy to the thermoelectric component 106. In another example, such as found on the smart watch's strap/band or the belt for the trousers, the electronic circuitry can be mounted on flexible and high thermal conductive materials to support the device's usage model and the transfer of thermal energy to the centralized thermal electric power conversion circuitry.

As mentioned, the computing system 105 may also include a thermoelectric component 106 which may be any type of device or component that is capable of converting thermal energy into electrical energy. In some embodiments, the thermoelectric component 106 may be a thermoelectric generator or convertor using a phenomenon called the Seebeck effect to convert thermal energy to electrical energy. The thermoelectric component 106 may be a semiconductor device made from bismuth telluride, lead telluride, calcium manganese oxide, or combinations thereof, for example.

In embodiments, the thermoelectric component 106 may be coupled with the thermal conductive material 104 such that it receives the thermal energy stored in the phase change material 102. For example, the thermoelectric component 106 may include one or more surfaces that are in physical and/or thermal contact with one or more surfaces of the thermal conductive material 104. These contacts may be used to transfer the thermal energy between the phase change material 1 (02 and the thermoelectric component 106 via the thermal conductive material 104. In some embodiments, the thermoelectric component 106 may also receive thermal energy directly from one or more components of a computing device. Various embodiments are not limited in this manner.

The thermoelectric component 106 may also be coupled with one or more other components of the computing system 105. For example, the thermoelectric component 106 may be coupled with a battery component 132 and may transfer generated electrical energy to the battery component 132 for storage. In another example, the thermoelectric component 106 may also be coupled with a processing component 134 and a memory component 136 and may transfer generated electrical energy to these components to power. In a third example, the thermoelectric component 106 may be coupled with an inductor or charging coil. In this example, the thermoelectric component 106 may provide electrical energy to the induction coil which may in turn charge another device or component. Various embodiments are not limited in this manner and the thermoelectric component 106 may be coupled with any number of components or devices.

The computing system 105 may also include a printed circuit board 130 which may include any number of components coupled by one or more traces, buses and so forth. The printed circuit board 130 may be any type of structure that mechanically supports and electrically connects electronic components, such as battery component 132, processing component 134, and memory component 136. The components may be coupled via conductive traces, pads and other features etched from copper sheets laminated onto a non-conductive substrate. In embodiments, the printed circuit board 130 may be single sided, doubled sided, single layered, and/or multi-layered. Conductors and traces on different layers may be coupled together via one or more through holes.

In embodiments, the printed circuit board 130 may be enclosed within a housing or enclosure and may be at least partially surrounded by the phase change material 102. In these embodiments, the phase change material 102 may absorb thermal energy generated by one or more components on the printed circuit board 130. The thermal energy may be transferred from the phase change material 102 to a thermoelectric component 106 via one or more traces on the printed circuit board 130. In other words, the traces may be the thermal conductive material 104 to transfer the thermal energy to the thermoelectric component 106. Various embodiments are not limited in this manner and in some embodiments, the printed circuit board 130 may not be surrounded by the phase change material 102 and a different thermal conductive material 104 may be used to transfer thermal energy to the thermoelectric component 106.

As previously mentioned, the printed circuit board 130 may include a battery component 132, a processing component 134 and a memory component 136. The battery component 132 may be any type of energy storage device. The battery component 130 can be a device having one or more electrochemical cells that convert stored chemical energy into electrical energy. Each cell contains a positive terminal, or cathode, and a negative terminal, or anode. Electrolytes allow ions to move between the electrodes and terminals, which allows current to flow out of the battery to perform work. In embodiments, the battery component 132 may be rechargeable such that it may receive current from another component such as the thermoelectric component 106 for storage and later use. Moreover and at some later point in time, the stored electrical energy may be provided to other components to perform work and various operations. The battery component 132 may be any type of battery capable of storing energy.

In various embodiments, the processing component 134 may be one or more of any type of computational element, such as but not limited to, a microprocessor, a processor, central processing unit, digital signal processing unit, dual core processor, mobile device processor, desktop processor, single core processor, a system-on-chip (SoC) device, complex instruction set computing (CISC) microprocessor, a reduced instruction set (RISC) microprocessor, a very long instruction word (VLIW) microprocessor, or any other type of processor or processing circuit on a single chip or integrated circuit or processing circuitry. The processing component 134 may be connected to and communicate with the other elements and components of the computing system 105 via interconnects, such as one or more buses, control lines, traces and data lines. Various embodiments may also include more than one processing component 134 and are not limited in this manner.

In one embodiment, the printed circuit board 130 may include a memory component 136, as desired for a given implementation. The memory component 136 may be implemented using any machine-readable or computer-readable media capable of storing data, including both volatile and non-volatile memory. In some embodiments, the machine-readable or computer-readable medium may include a non-transitory medium. The embodiments are not limited in this context.

The memory component 136 can store instructions and data momentarily, temporarily, or permanently. Further, the memory component 136 may also store temporary variables or other intermediate information while the processing component 134 is executing instructions. The memory component 136 is not limited to storing the above discussed data and may store any type of data.

Various embodiments are not limited to these components and the printed circuit board 130 may include more or less components. For example and as illustrated in FIG. 1B the printed circuit board may also include the thermoelectric component 106.

Figure 1B:
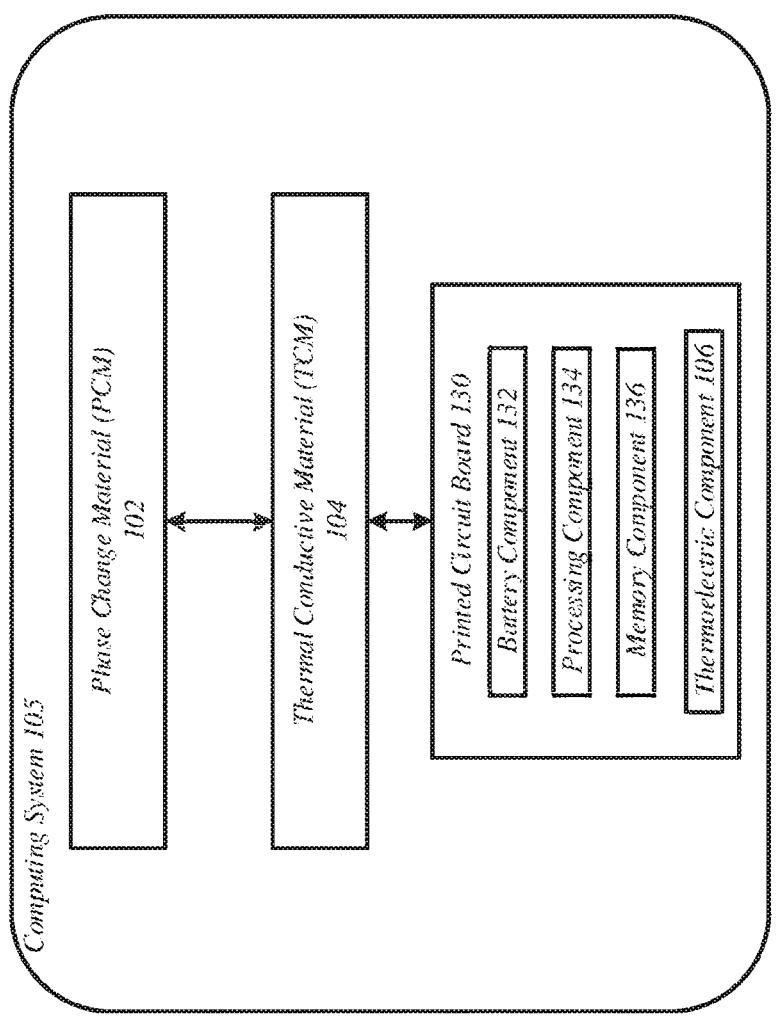
FIG. 1B illustrates a second example embodiment of a computing system.

More specifically, FIG. 1B illustrates a second example embodiment of computing system 105. In this illustrated embodiment, the thermoelectric component 106 may be a component of or on the printed circuit board 130. In this embodiments, the phase change material 102 may be coupled with the thermoelectric component 106 on the printed circuit board 130 via the thermal conductive material 104. Computing system 105 illustrated in FIG. 1B may operate in the same manner as computing system 105 illustrated in FIG. 1A.

Figure 2B:
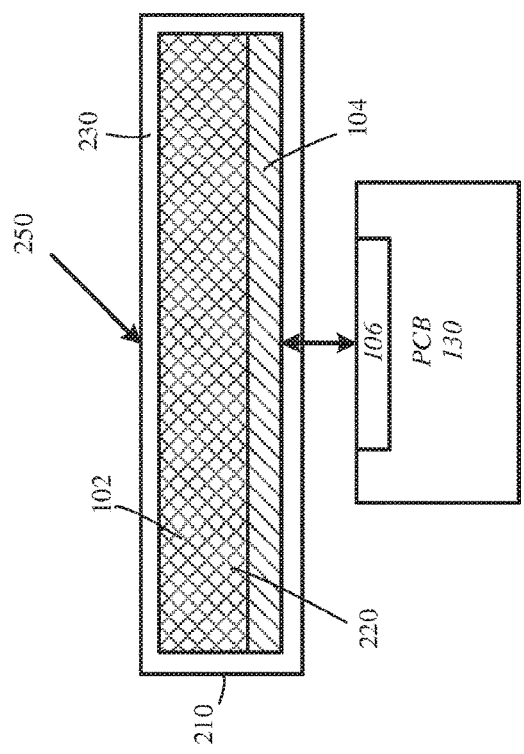
FIG. 2B illustrates a cross sectional view of a second example embodiment of an enclosure for phase change material.
Figure 2A:
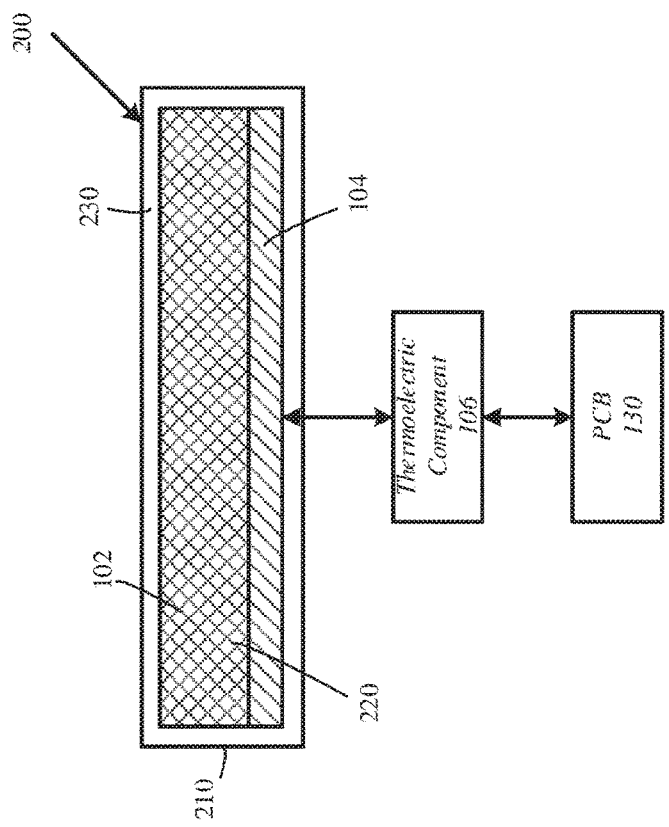
FIG. 2A illustrates a cross sectional view of an example embodiment of an enclosure for phase change material.

FIG. 2A/2B illustrate cross sectional views of example embodiments of device 200 and 250 including an enclosure 210 having phase change material 102 disposed within. In some embodiments, the enclosure 210 may include one or more sides or walls which can form any shape capable of forming a cavity 220. Moreover, the phase change material 102 may be disposed within the cavity 220 formed by the one or more sides or walls of the enclosure 210. In some embodiments, the one or more sides of the enclosure 210 may include an insulation portion 230 or be made of a thermal insulation material, such as polystyrene. The insulation portion 230 can help prevent thermal energy loss or thermal energy escaping to an outside environment to ensure that more thermal energy is provided to a thermoelectric component 106 via a thermal conductive material 104.

Further and although FIG. 2A illustrates all of the sides of the enclosure 210 including insulation material 230, various embodiments are not limited in this manner. For example, one or more sides of the enclosure 210 may not be made of insulation, and one or more sides may be made of a different material, such as a material to conduct thermal energy. More specifically, embodiments may include an enclosure 210 having one side of thermal conductive material, such as a metal to conduct thermal energy from an outside source to the phase change material 102 and the remaining sides may be made of insulating material. Various embodiments are not limited in this manner and the sides can be made of any material in any configuration.

Although FIG. 2A illustrates enclosure 210 having a substantially rectangular shape, various embodiments are not limited in this manner and the enclosure 210 may be any shape capable of forming a cavity 210 and storing the phase change material 102. For example and in some embodiments, the enclosure 210 may be in the form of a wrist watch band, a coffee mug, an enclosure to house computing components, and so forth. Various embodiments are not limited in this manner.

In addition to the phase change material 102, the thermal conductive material 104 may also be disposed within cavity 220 of the enclosure 210. The thermal conductive material 104 may be disposed within the cavity 220 in any suitable manner to maximize surface area contact with the phase change material 102. For example, the thermal conductive material 104 may be disposed on an inner portion of one side of the enclosure 210, as illustrated in FIG. 2A. However, various embodiments are not limited in that manner and in some embodiments the thermal conductive material 104 may be disposed such that it surrounds the phase change material 102. In another example, the thermal conductive material 104 may be disposed within the cavity 220 in any suitable manner such that the phase change material 102 surrounds the thermal conductive material 104. Various embodiments are not limited in this manner.

In some embodiments, the thermal conductive material 104 may couple or contact the phase change material 102 and a thermoelectric component 106 such that the thermal energy is transferred from the phase change material 102 to the thermoelectric component 106. In some embodiments, the thermal conductive material 104 may be surrounded by the phase change material 102 and one or more ends or surfaces may also couple or contact the thermoelectric component 106 such that the thermal energy is transferred. Various embodiments are not limited in this manner.

As mentioned, the thermoelectric component 106 which may be any type of device or component that is capable of converting thermal energy into electrical energy. In some embodiments, the thermoelectric component 106 may be a thermoelectric generator or convertor and may be a semiconductor device made from bismuth telluride, lead telluride, calcium manganese oxide, or combinations thereof, for example.

In embodiments, the thermoelectric component 106 may be coupled with the thermal conductive material 104 such that it receives the thermal energy stored in the phase change material 102. For example, the thermoelectric component 106 may include one or more surfaces that are in physical and/or thermal contact with one or more surfaces of the thermal conductive material 104. These contacts may be used to transfer the thermal energy between the phase change material 102 and the thermoelectric component 106 via the thermal conductive material 104.

The thermoelectric component 106 may also be coupled with one or more other components such as components on PCB 130. For example, the thermoelectric component 106 may be coupled with a battery component 132 and may transfer generated electrical energy to the battery component 132 for storage. In another example, the thermoelectric component 106 may also be coupled with a processing component 134 and a memory component 136 and may transfer generated electrical energy to these components to power. In a third example, the thermoelectric component 106 may be coupled with an inductor or charging coil. In this example, the thermoelectric component 106 may provide electrical energy to the induction coil which may in turn charge another device or component. Various embodiments are not limited in this manner and the thermoelectric component 106 may be coupled with any number of components or devices. In some embodiments, the thermoelectric component 106 may be part of the PCB 130 as illustrated in FIG. 2B.

FIG. 3A illustrate another cross sectional view of example embodiment of device 300 including an enclosure 210 having phase change material 102 disposed within. In this example embodiment, the device 300 may include enclosure 210 to house one or more computer components, such as those typically found on a PCB 130. For example, device 300 may be a computing device and enclosure 210 may be a computer chassis. Alternatively, enclosure 210 illustrated in FIG. 3A may be an enclosure inside of a chassis. Various embodiments are not limited in this manner.

As similarly discussed above, the enclosure 210 may include one or more sides or walls, and may be any shape capable of forming a cavity 220. Moreover, phase change material 102 may be disposed within the cavity 220 formed by the one or more sides or walls of the enclosure 210. In some embodiments, the one or more sides of the enclosure 210 may include an insulation portion 230 or be made of a thermal insulation material.

Further and as illustrated in FIG. 3A, PCB 130 may also be disposed within enclosure 210 such that the PCB 130 is at least partially surrounded by phase change material 102. By at least partially surrounding the PCB 130 including one or more components, the phase change material 102 may absorb thermal energy generated by the one or more components of the PCB 130. For example, the PCB 130 may include a processing component 134, as illustrated in FIGS. 1A and 1B, which may generate heat or thermal energy while processing information. This generated thermal energy may be absorbed by the phase change material 102.

Further, device 300 may include a thermal conductive material 104 to transfer thermal energy from the phase change material 102 to a thermoelectric component 106. In some embodiments, the thermal conductive material 104 may be one or more traces on the PCB 130 to transfer thermal energy, e.g. a ground plane. However, various embodiments are not limited in this manner and the thermal conductive material 104 may be separate from the PCB 130.

FIG. 3B illustrates a top down component view of device 300. Although not shown in FIG. 3B, the components of the PCB 130 including the thermoelectric component 106, the battery component 132, the processing component 134 and the memory component 136 may be surrounded by the phase change material 102 to absorb thermal energy. In this example embodiment and as discussed above, one or more traces of the PCB 130 may be used as the thermal conductive material 104 to transfer thermal energy from the phase change material 102 to a thermoelectric component 106 for conversion into electrical energy. For example, a ground plane 352 made of copper (or any other conductive material) may be used to transfer the thermal energy stored in the phase change material 102 to the thermoelectric component 106. More specifically, the ground plane 352 may be in physical contact and/or thermal contact with the phase change material 102 and the thermoelectric component 106. The thermoelectric component 106 may receive thermal energy from the phase change material 102 via the traces. In this example, the phase change material 102 may be selected such that it is not harmful or corrosive to the physical and operational features of the components on the PCB 130.

Figure 4A:
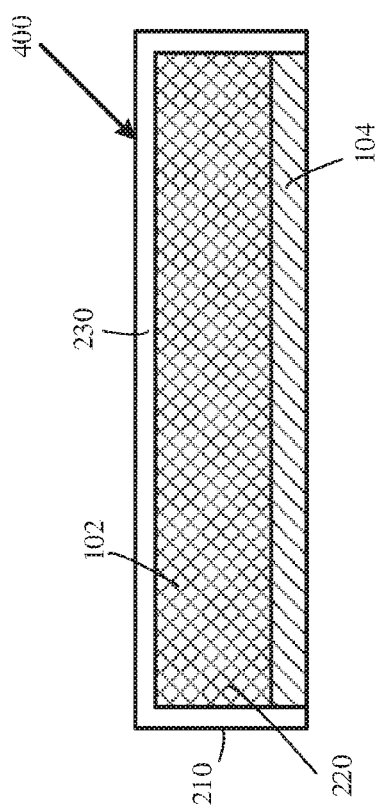
FIG. 4A illustrates an example embodiment of a watch band enclosure in a cross section view.

FIG. 4A illustrates a cross section view of another embodiment of a device, and in particular, a watch band 400 including an enclosure 210 having phase change material 102 disposed within. The watch band 400 includes the enclosure 210 defining a cavity 220 for the phase change material 102. In various embodiments, watch band 400 illustrated in FIG. 4A may be made of a flexible material such as silicone rubber which may include an insulation portion 230. However, various embodiments are not limited in this manner and the watch band 400 may be made of any material capable of having a cavity 220 to store the phase change material 102 including metal, ceramic, nylon, leather, faux leather and so forth.

In some embodiments and as illustrated in FIG. 4A, the enclosure 210 may include the insulation portion 230 and a thermal conductive material 104 as one or more of the sides or walls. Moreover, the thermal conductive material 104 may be part of the enclosure 210 and may act a side to enclose the phase change material 102. In one example, three "sides" of enclosure 210 may be made of an insulation material 230 and a fourth "side" may be made of a thermal conductive material 104. More specifically, the thermal conductive material 104 may define the inner portion of the watch band 400 such that when the watch band is worn on a person's wrist the thermal conductive material 104 is in contact with the wrist. Thus, thermal energy from a person's body may be absorbed by the thermal conductive material 104 and transferred to the phase change material 102. In addition, the thermal conductive material 104 may also be coupled with or in contact with a thermoelectric component 106. Thermal energy stored in the phase change material 102 and/or generated by a person may be transferred or conducted to the thermoelectric component 106 via the thermal conductive material 104.

Figure 4B:
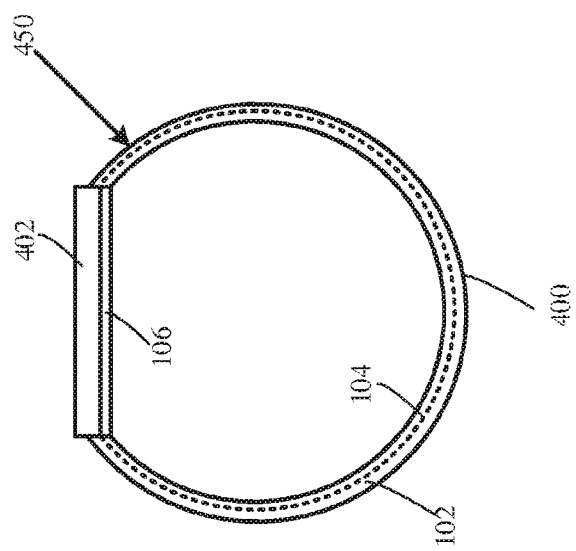
FIG. 4B illustrates a side view of an example embodiment of watch band enclosure coupled with a watch face.

FIG. 4B illustrates a cross section view of an embodiment of watch 450 including the watch band 400 and a watch portion 402. The watch portion 402 may include one or more components capable of keeping time and operating as a watch. For example, the watch portion 402 may include one or more electronic components, one or more mechanical components, or combination thereof and may operate to keep time to display to a user.

In some embodiments, the watch portion 402 may include or be coupled with a thermoelectric component 106 which may be used to convert thermal energy to electrical energy for use by the watch portion 402. For example, the watch portion 402 may include a battery which may store the electrical energy and supply power to the watch portion 402. Various embodiments are not limited in this manner and the thermoelectric component 106 may be used directly to power the watch portion 402.

As illustrated in FIG. 4B, the watch band 400 may be coupled with the watch portion 402 and the thermoelectric component 106 at one or more ends. For example, the watch band 400 may be coupled with the watch portion 402 by a securing fastener such as a band end piece. Further, the watch band 400 including the thermal conductive material 104 may be coupled with the thermoelectric component 106 via one or physical connection points. Thus, the thermal energy stored in the phase change material 102 and generated by a person may be transferred to the thermoelectric component 106 and converted into electrical energy. In various embodiments, the watch band 400 may be coupled with the thermoelectric component 106 such that a maximum amount of thermal energy is transferred to the thermoelectric component 106.

Although FIGS. 4A and 4B illustrate the thermal conductive material 104 as one of the "sides" of the enclosure 210 various embodiments are not limited in this manner. In some embodiments, another layer of material, such as a conductive or insulating material, may be the side wall such that it holds the thermal conductive material 104 within the cavity 220, but still allows thermal energy to flow from a person to the phase change material 102. Other embodiments may be contemplated.

Figure 5:
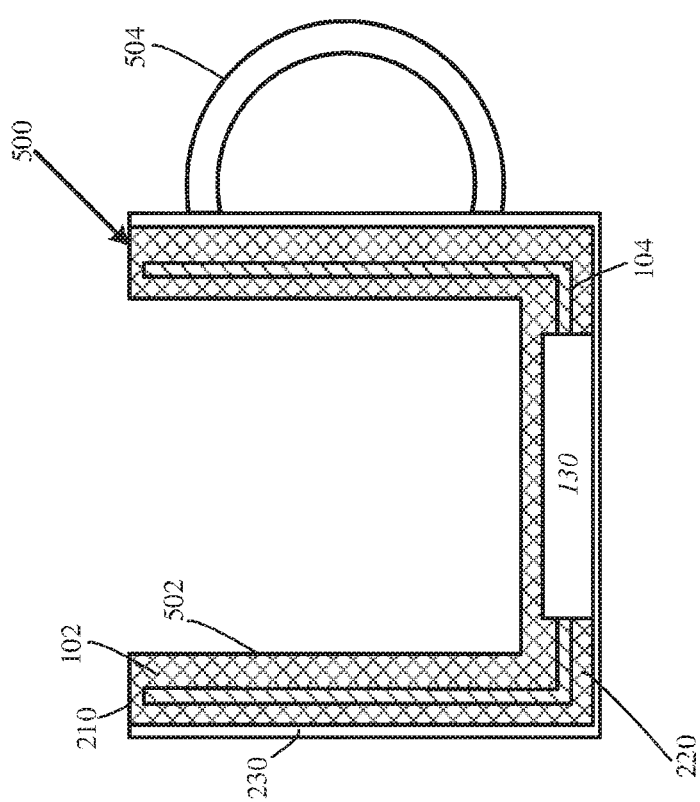
FIG. 5 illustrates a cross sectional view of an example embodiment of a mug enclosure.

FIG. 5 illustrates a cross section view of an embodiment of a mug 500 including an enclosure 210 to store phase change material 102. In the illustrated embodiment, the mug 500 may include a mug portion 502 and a handle portion 504. The mug portion 502 may have a cylinder shape with one closed end to hold any type of liquid including, coffee, tea, milk, hot chocolate, and so forth. Further, the handle portion 504 may generally have a semi-circular shape such that a person may pick up the mug 500. Various embodiments are not limited to these shapes for the mug 500 and other shapes may be contemplated as long as the mug portion 502 is capable of holding a fluid and the handle portion is capable of being held by a person or user.

In embodiments, the mug portion 502 may include an enclosure 210 defining a cavity 220. Further, the mug portion 502 may include an outer surface of insulating material 230. The insulating material 230 may be made of a material such that when a hot fluid or liquid is stored within the mug portion 502 it does not burn or cause harm to a user of the mug 500. The insulating material 230 can also provide a barrier so that thermal energy is not released to an outside environment and is stored within phase change material 102 in the mug portion 502.

As similarly discussed above, phase change material 102 may be disposed within enclosure 210 and cavity 220. The enclosure 210 and the cavity 220 may take any shape to store the phase change material 102. For example, phase change material 102 may be disposed within an outer wall and inner wall of the mug portion 502. Although FIG. 5 illustrates the cavity 220 as being one continuous cavity within the mug portion 502, various embodiment are not limited in this manner. In some embodiments, the mug portion 502 may be divided into a number of cavities or chambers, each capable of storing phase change material 102.

Further, thermal conductive material 104 can be disposed within the cavity 220 and enclosure 210. In some embodiments, the thermal conductive material 104 may be disposed with in the walls and base of the mug portion 502. In addition, the thermal conductive material 104 may be disposed within the mug portion 502 and may be surrounded by phase change material 102. Moreover, the thermal conductive material 104 may be disposed within inner and outer walls of the mug portion 502 such that a maximum surface area of the thermal conductive material 104 is in contact with the phase change material 102.

The mug portion 502 including the enclosure 210 and cavity 220 may also house a PCB 130, which may include one or more components as previously discussed. In some embodiments, the PCB 130 may be stored within a base of the mug portion 502. However, various embodiments are not limited in this manner and other locations for the PCB 130 may be contemplated.

In embodiments, the phase change material 102 within the enclosure 210 of the mug portion 502 may receive thermal energy from a hot liquid poured in the mug 500, for example. The phase change material 102 may store thermal energy that can be transferred to a thermoelectric component for conversion to electrical energy. More specifically, the phase change material 102 may be thermally and/or physically coupled with thermal conductive material 104 such that thermal energy can be transferred to a thermoelectric component 106 on or coupled with a PCB 130. Once converted, the electric energy may be used to power other components on the PCB 130, such as a processing component, a memory component, a display component, and so forth.

In another example, the PCB 130 may include an induction coil component to transfer electrical energy to another component via induction means. For example, the mug 500 may be placed within proximity (a few inches, centimeters, etc.) of another electronic device, such as a mobile computing device having an induction coil to receive the electric energy. The electric energy may be received by the mobile computing device and used to charge or power one or more components of the mobile computing device including a battery component and/or a processing component. A device may be considered within proximity of the mug 500 if is capable of receiving electric energy via an induction coil.

Although not illustrated in FIG. 5, in some embodiments the handle portion 504 of the mug 500 may also include phase change material 102 and a thermal conductive material 104 to store thermal energy and transfer the thermal energy to a thermoelectric component for conversion. In addition, other form factors and enclosures may be considered and contemplated. For example, phase change material and thermal conductive material may be incorporated into other enclosures, such as a bowl, a plate, a vase, a picture frame, other any other type of household objects. Other example form factors may include wearable eyeglasses or frames, hats, jewelry, belts, shoes, clothing, and so forth. Any form factor may be considered such that it can hold phase change material and thermal conductive material.

Figure 6:
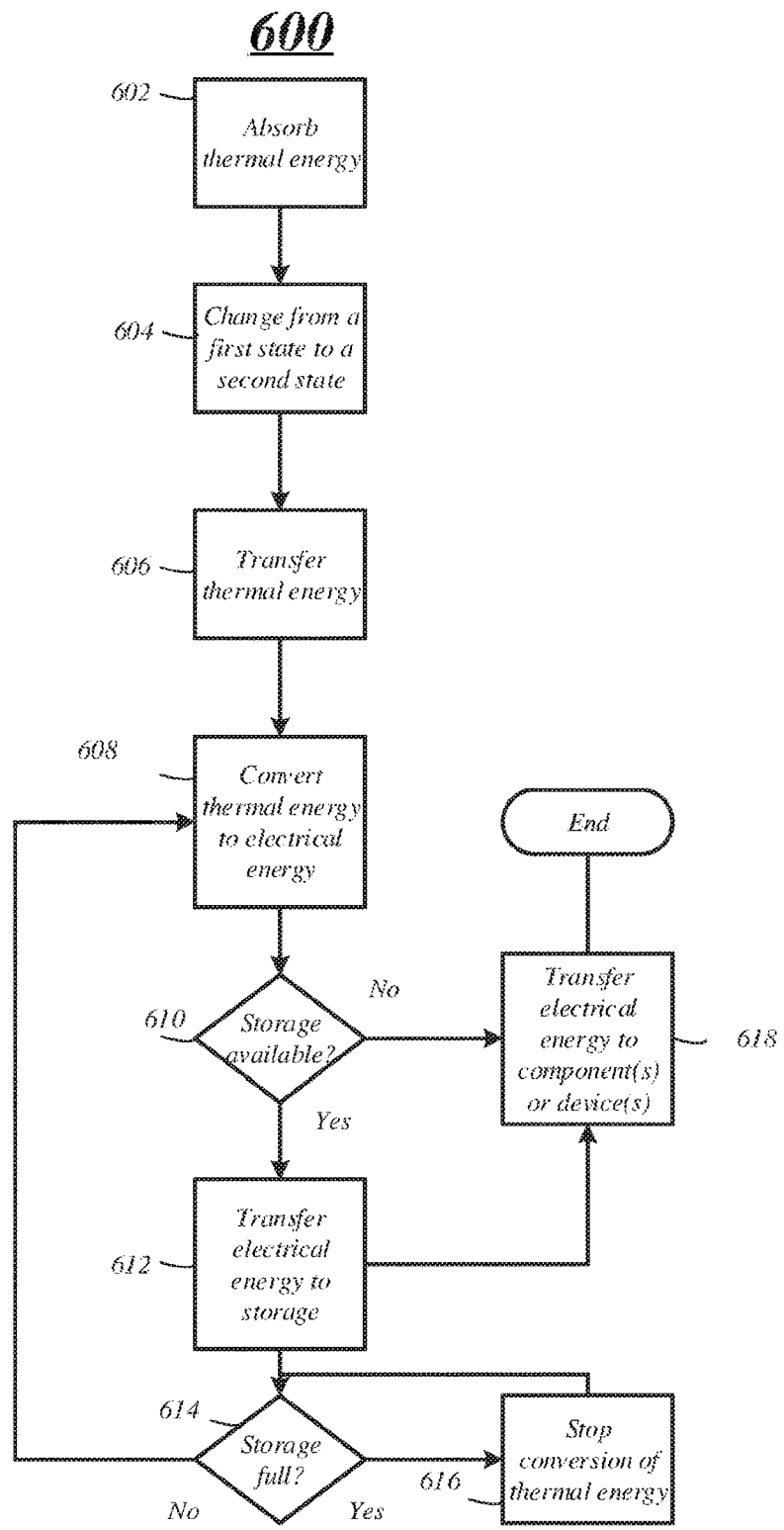
FIG. 6 illustrates an example embodiment of a first logic flow diagram.

FIG. 6 illustrates an embodiment of a logic flow diagram 600. The logic flow 600 may be representative of some or all of the operations executed by one or more embodiments described herein. For example, the logic flow 600 may illustrate operations performed by one or more of the computing systems 105 and devices of FIGS. 3A-5. Various embodiments are not limited in this manner.

In various embodiments, logic 600 may include absorbing thermal energy at block 602. For example, a phase change material 102 may absorb thermal energy generated by a source, such as a computing component, a hot liquid or fluid, a human body, and so forth. In some embodiments, the phase change material 102 may be located within an enclosure or a cavity of an enclosure and may absorb the thermal energy through one or more sides or walls of the enclosure. More specifically, the phase change material 102 may within a cavity of a wearable object such as a watch or eyeglasses and the thermal energy may be transferred from a human wearing the wearable object to the phase change material 102 through a wall or side of the enclosure, for example. In another example, the phase change material may be within a cavity formed by inner and outer walls of a mug and may absorb thermal energy generated by a hot liquid poured within the mug. In a third example, the phase change material may be within a cavity defined by walls or sides of an enclosure to house one or more computing components. In this example, the phase change material 102 may absorb thermal energy generated by the one or more computing components. Various embodiments are not limited to these examples, and thermal energy may be absorbed by phase change material generated by any source in any number of different enclosures.

In some embodiments, the logic flow 600 may include a phase change material 102 changing from a first state to a second state at block 604. More specifically, upon or while absorbing thermal energy, the phase change material 102 may change from a solid state to a liquid state, or from a liquid state to a gaseous state. The state change may occur at a specific thermal temperature based on the characteristics and properties of the phase change material 102. For example, a phase change material 102 may change from a solid state to a liquid state at a melting temperature (melting point) and from a liquid state to a gaseous state at a boiling temperature (boiling point). Each of the phase change materials may have a particular melting point and a particular boiling point and may be chosen based on these characteristics.

In embodiments and at block 606, the thermal energy may be transferred from the phase change material 102 to a thermoelectric component 106. More specifically, the phase change material 102 may be coupled, thermally and/or physically, with a thermal conductive material 104 which may transfer the thermal energy from the phase change material 102 to a thermoelectric component 106. In some embodiments, the thermal conductive material 104 may be surrounded by the phase change material 102 to absorb the thermal energy, for example. In another example, the thermal conductive material 104 may be one or more traces on a PCB 130. In a third example, the thermal conductive material 104 may be one or more sides of an enclosure to absorb the thermal energy. Various embodiments are not limited to these examples.

The logic 600 may also include converting, by the thermoelectric component 106, the thermal energy into electrical energy at block 608. In some embodiments, the thermoelectric component 106 may be a thermoelectric generator or convertor which may use the phenomenon called the Seebeck effect to convert thermal energy to electrical energy. The thermoelectric component 106 may be a semiconductor device made from bismuth telluride, lead telluride, calcium manganese oxide, or combinations thereof, for example.

Further and at block 610, a determination may be made as to whether storage is available to store the electrical energy. For example, the system may determine whether a battery component is available to send the electrical energy for storage and later use. If storage is not available at block 610, the electrical energy may be sent directly to one or more components, such as processing components and memory components at block 618. The components may use the electrical energy in real-time as it is being converted from thermal energy to electrical energy, for example. In some embodiments, the electrical energy may be sent to one or more other devices for use at block 618. For example, the electrical energy may be sent to another device via induction or any other wireless power transfer technique.

If storage is available at block 610, the electrical energy may be transferred to the storage at block 612. The electrical energy stored in the storage may be transferred to one or more components, such as processing components and memory components at block 618. In some embodiments and at block 618 a determination may be made as to whether the storage is full or not. If the storage is full, various embodiments may include pausing or stopping the conversion of energy from thermal energy to electrical energy until storage becomes available at block 616. In some embodiments, the conversion may be stopped for a specific amount of time and then another determination may be made as to whether storage is full or not at block 614 If the storage is not full, the conversion of thermal energy to electrical energy may continue. Various embodiments are not limited in this manner. For example, certain steps or blocks may occur in a different order or may not occur at all. In addition, blocks 602 through 618 may occur any number of times in a continuous or non-continuous basis.

Figure 7:
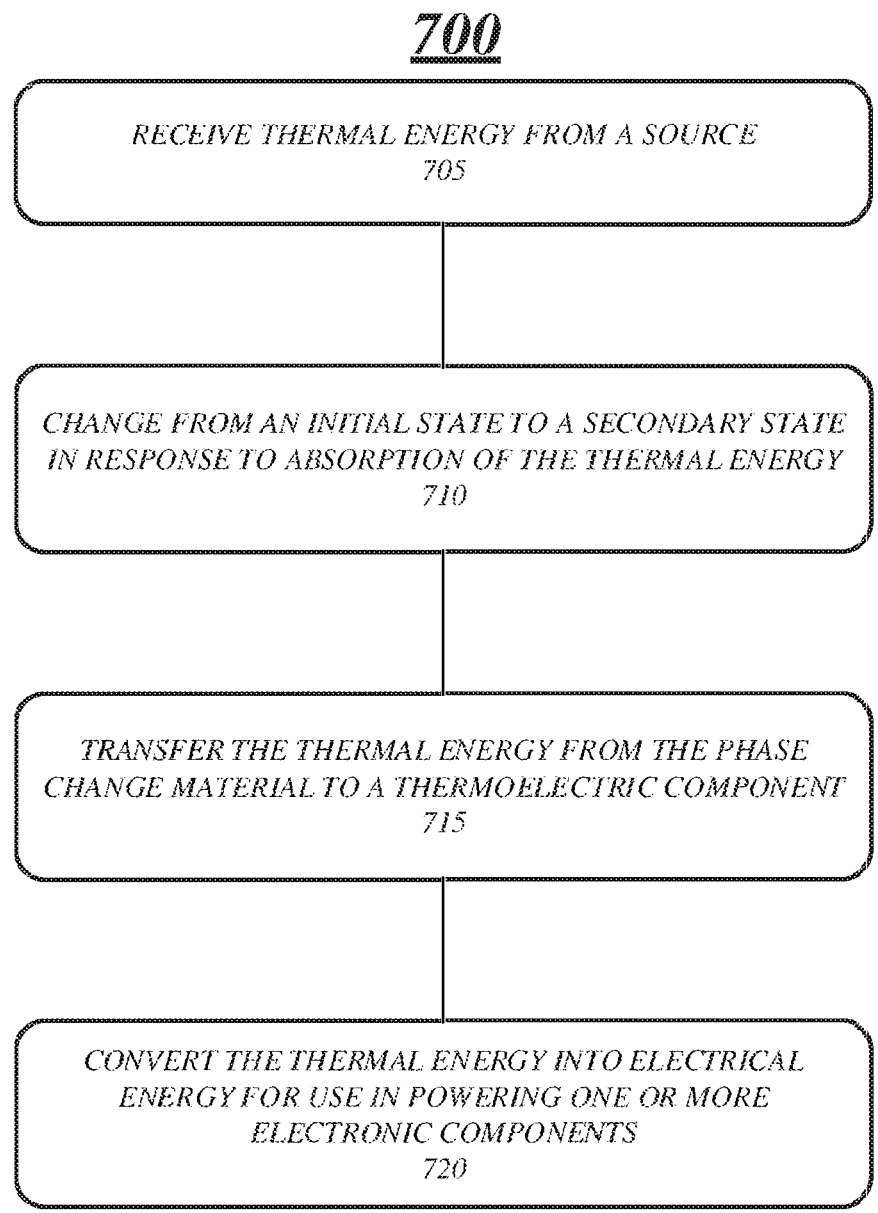
FIG. 7 illustrates an example embodiment of a second logic flow diagram.

FIG. 7 illustrates an embodiment of a logic flow diagram 700. The logic flow 700 may be representative of some or all of the operations executed by one or more embodiments described herein. For example, the logic flow 700 may illustrate operations performed by computing system 105 and devices of FIGS. 3A-5.

In the illustrated embodiment shown in FIG. 7, the logic flow 700 may include receiving thermal energy from a source at block 705. For example, a device including phase change material may receive thermal energy from any source that may be generate heat, such as a hot liquid, a human body, one or more electronic component, any other heat source including ambient air temperature.

In some embodiments, the thermal energy may be received by the phase change material through one or more sides or walls of enclosure. The sides or walls may be made of any material including materials that are capable of conducting thermal energy, such as a thermal conductive material. Various embodiments are not limited in this manner.

In some embodiments, the logic flow 700 may include changing, by a phase change material, from an initial state to a secondary state in response to absorption of the thermal energy at block 710. For example, the phase change material may change from a solid state to a liquid state or from a liquid state to a gaseous state. The changing of the phase change material states indicates that the phase change material is absorbing and storing the thermal energy from the source. Moreover, instead of the thermal energy being lost to an outside environment, the thermal energy may be stored in the phase change material for later use. For example and in some embodiments, the thermal energy may be converted to electrical energy to power one or more components and/or to be stored in a battery.

In some embodiments, at block 715, the logic flow 700 may include transferring, by a thermal conductive material, the thermal energy from the phase change material to a thermoelectric component. The thermal conductive material may be any material that is capable of conducting thermal energy and may be coupled with the phase change material thermally and/or physically. For example, a portion of the thermal conductive material may be coupled with the phase change material and another portion may be coupled with the thermoelectric component. The thermal energy stored in the phase change material may be conducted to the thermoelectric component via the thermal conductive material.

The logic flow 700 may also include converting the thermal energy into electrical energy for use in powering one or more electronic components at block 720. For example, the thermal energy may be received by a thermoelectric component which may convert the thermal energy to electrical energy. The electrical energy may be used by one or more components for power to perform work. In some embodiments, the electrical energy may be stored in a battery and used by the one or more components for power at a later point in time. In another example, the electrical energy may be provided to an induction means, such as one or more induction coils, which may be used to transfer the electrical energy to another device. Various embodiments are not limited in this manner and other uses of the electrical energy may be contemplated.

Figure 8:
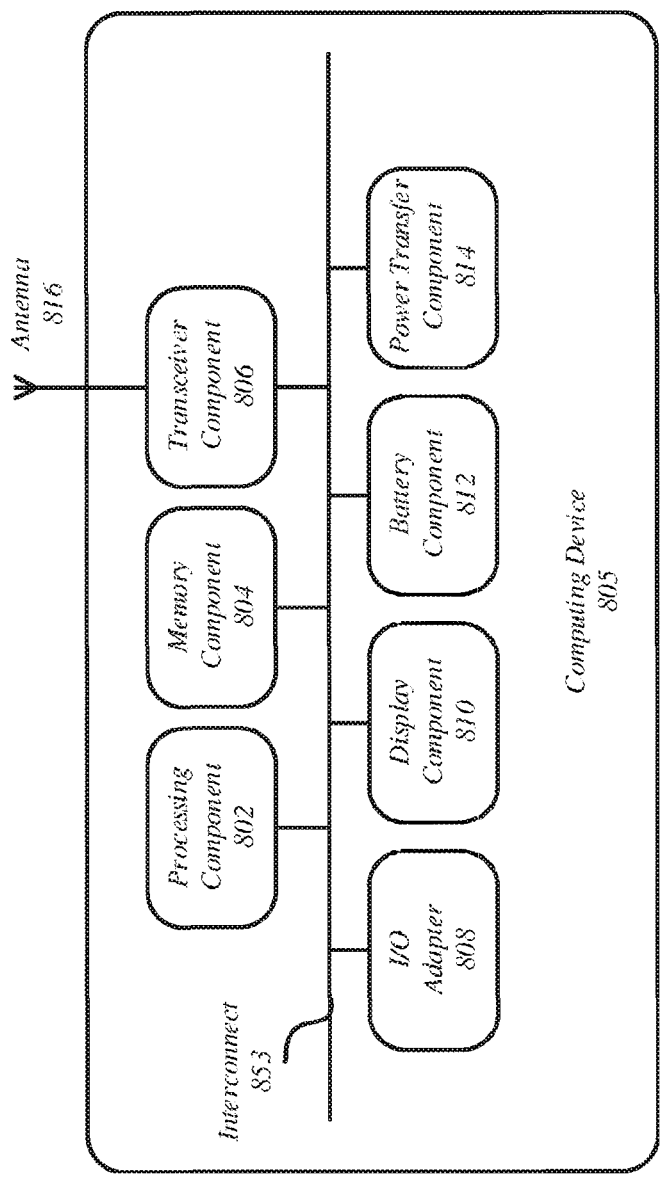
FIG. 8 illustrates an example embodiment of a computing device.

FIG. 8 illustrates an embodiment of a computing device 805. In various embodiments, computing device 805 may be representative of a computing device or system for use with one or more embodiments described herein, such computing system 105, devices of FIGS. 3A-5. of FIGS. 1-3, and logic flows 600 of FIG. 6 and 700 of FIG. 7.

In various embodiments, computing device 805 may be any type of computing device including a computing device including a personal computer (PC), laptop computer, ultra-laptop computer, netbook computer, ultrabook computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth. The computing device 805 may also including servers, such as a network server, a blade server, a SMP server, and so forth.

Examples of a computing device 805 also may include computers that are arranged to be worn by a person, such as a wrist computer, finger computer, ring computer, eyeglass computer, belt-clip computer, arm-band computer, shoe computers, clothing computers, and other wearable computers. In embodiments, for example, a computing device 805 may be implemented as a smart phone capable of executing computer applications, as well as voice communications and/or data communications. Although some embodiments may be described with a computing device 805 implemented as a smart phone by way of example, it may be appreciated that other embodiments may be implemented using other wireless mobile computing devices as well. The embodiments are not limited in this context. In some embodiments, computing device 805 may also be a navigation system, infotainment system, embedded in home appliances, etc.

As shown in FIG. 8, computing device 805 may include multiple elements. One or more elements may be implemented using one or more circuits, components, registers, processors, software subroutine modules, or any combination thereof, as desired for a given set of design or performance constraints. Although FIG. 8 shows a limited number of elements in a certain topology by way of example, it can be appreciated that more or less elements in any suitable topology may be used in computing device 805 as desired for a given implementation. The embodiments are not limited in this context.

In various embodiments, computing device 805 may include one or more processing unit(s) 802. Processing unit(s) 802 may be one or more of any type of computational element, such as but not limited to, a microprocessor, a processor, central processing unit, digital signal processing unit, dual core processor, mobile device processor, desktop processor, single core processor, a system-on-chip (SoC) device, complex instruction set computing (CISC) microprocessor, a reduced instruction set (RISC) microprocessor, a very long instruction word (VLIW) microprocessor, or any other type of processor or processing circuit on a single chip or integrated circuit or processing circuitry. The processing unit(s) 802 may be connected to and communicate with the other elements and components of the computing system via an interconnect 543, such as one or more buses, control lines, and data lines.

In one embodiment, computing device 805 may include memory 804 to couple to processing unit(s) 802. In various embodiments, the memory 804 may store data and information for use by the computing device 805.

Memory 804 may be coupled to processing unit(s) 802 via interconnect 853, or by a dedicated communications bus between processing unit(s) 802 and memory 804, as desired for a given implementation. Memory 804 may be implemented using any machine-readable or computer-readable media capable of storing data, including both volatile and non-volatile memory. In some embodiments, the machine-readable or computer-readable medium may include a non-transitory medium. The embodiments are not limited in this context.

The memory 804 can store instructions and data momentarily, temporarily, or permanently. The memory 804 may also store temporary variables or other intermediate information while the processing unit(s) 802 is executing instructions. The memory 804 is not limited to storing the above discussed data and may store any type of data.

The computing device 805 may include a transceiver 806 which includes one or more components and circuitry to transmit and receive information using radio-frequency signals. More specifically, the transceiver 806 may include circuitry to produce radio-frequency mobile radio signals which are to be sent and for processing radio-frequency mobile radio signals which have been received. To this end, the transceiver 806 may be coupled to one or more antenna 816. The transmitted or received mobile radio signals are in one or more particular frequency ranges, which are typically prescribed by the mobile radio standard(s) supported by the radio-frequency assemblies. For example, transceiver 806 may include circuitry to process information according to one or more IEEE standards, one or more peer-to-peer protocols, and so forth. Various embodiments are not limited in this manner and transceiver 806 may transmit or receive information via any standard in any frequency range with one more devices, as previously mentioned.

In various embodiments, the transceiver 806 may be used to communicate with one or more other devices or stations. The transceiver 806 may send and receive information from the stations as one or more packets, frames, and any other transmission structure in accordance with one or more protocols.

The computing device 805 may include input/output adapter 808. Examples of I/O adapter 808 may include Universal Serial Bus (USB) ports/adapters, IEEE 1394 Firewire ports/adapters, and so forth. The embodiments are not limited in this context.

For example, an 110 adapter 808 may also include an input device or sensor, such as one or more buttons, a keyboard, a keypad, a touchscreen display, a touch sensitive device, a microphone, a biometric finger printer reader, biometric eye scanner or any other device used for inputting information into computing device 805. Moreover, the I/O adapter 808 may be a sensor including any hardware or logic to detect one or more touches or inputs on or near a housing of the apparatus, a display of the apparatus including a touchscreen or touch sensitive display.

In various embodiments, the I/O adapter 808 may include one or more components to output information to a user. For example, the I/O adapter 808 may include a speaker to output an audible noise or a haptic feedback device to output a vibration. The I/O adapter 808 may be located any within or on computing device 805, or may be separate and connected to the computing device 805 via a wired or wireless connection.

The computing device 805 may also include a display 810. Display 810 may constitute any display device capable of displaying information received from processor units 802, such as liquid crystal display (LCD), cathode ray tube (CRT) display, a projector, and so forth. Various embodiments are not limited in this manner.

The computing device 805 may also include a battery component 812 which may be any type of device, circuitry, cell and so forth that is capable of storing, providing, and converting electrical energy. For example, the battery component 812 may include one or more electrochemical cells capable of converting chemical energy into electrical energy for supplying power, and vice versa for storing the electrical energy. The battery component 812 may include a NiCd battery, a NiMH battery, a NiZn battery, an AgZn battery, Lithium ion battery, and so forth. Various embodiments are not limited in this manner.

In some embodiments, the computing device 805 may include a power transfer component 814, such an induction coil which may transfer electrical energy using electromagnetic induction. Various embodiments are not limited in this manner.

Figure 9:
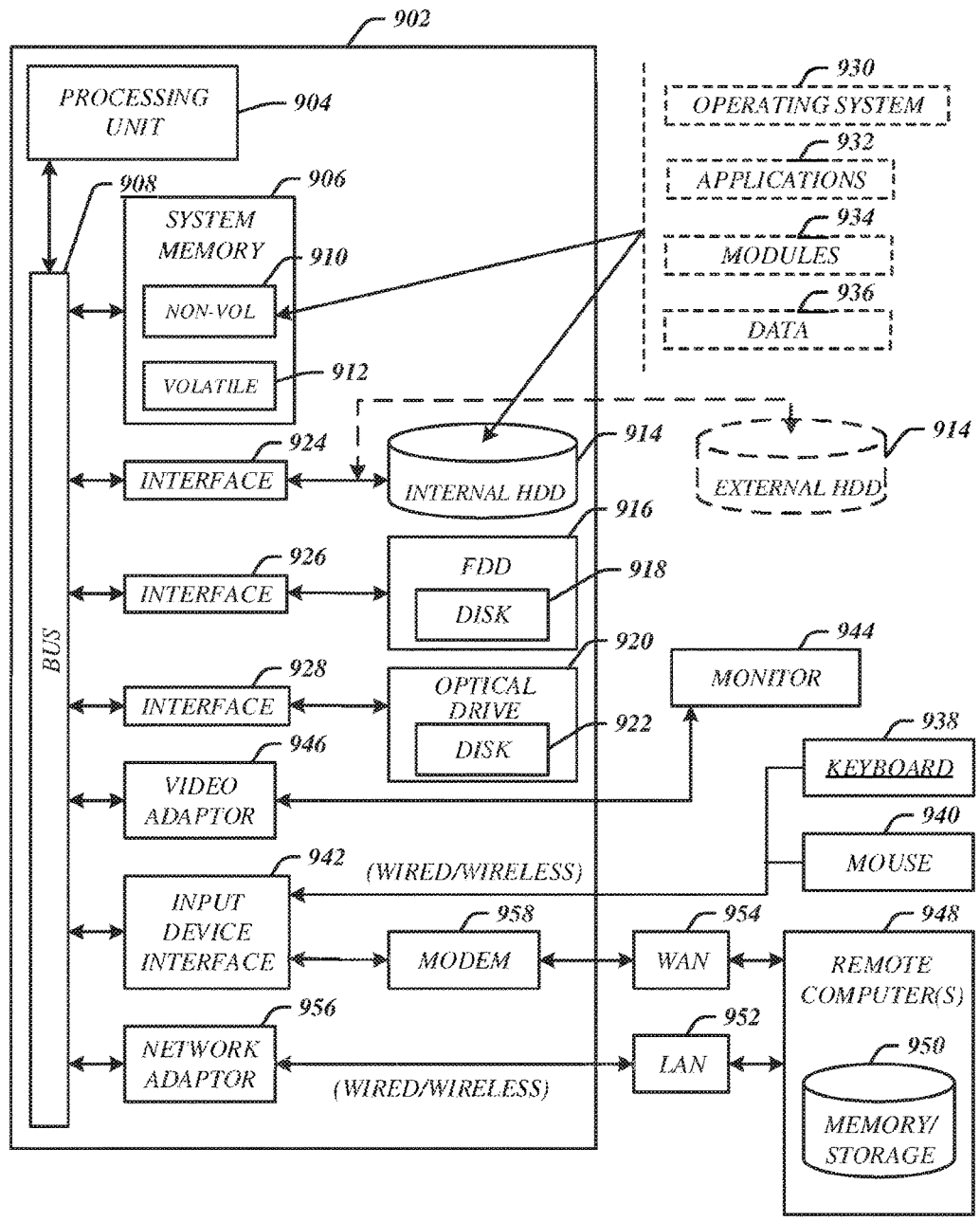
FIG. 9 illustrates an example embodiment of a computing architecture.

FIG. 9 illustrates an embodiment of an exemplary computing architecture 900 suitable for implementing various embodiments as previously described. In one embodiment, the computing architecture 900 may include or be implemented as part of system 105.

As used in this application, the terms "system" and "component" are intended to refer to a computer-related entity, either hardware, a combination of hardware and software, software, or software in execution, examples of which are provided by the exemplary computing architecture 900. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 900 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 900.

As shown in FIG. 9, the computing architecture 900 includes a processing unit 904, a system memory 906 and a system bus 908. The processing unit 904 can be any of various commercially available processors.

The system bus 908 provides an interface for system components including, but not limited to, the system memory 906 to the processing unit 904. The system bus 908 can be any of several types of bus structure that may further interconnect to a memory bus (with or without a memory controller), a peripheral bus, and a local bus using any of a variety of commercially available bus architectures. Interface adapters may connect to the system bus 908 via slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The computing architecture 900 may include or implement various articles of manufacture. An article of manufacture may include a computer-readable storage medium to store logic. Examples of a computer-readable storage medium may include any tangible media capable of storing electronic data, including volatile memory or non-volatile memory, removable or non-removable memory, erasable or non-erasable memory, writeable or re-writeable memory, and so forth. Examples of logic may include executable computer program instructions implemented using any suitable type of code, such as source code, compiled code, interpreted code, executable code, static code, dynamic code, object-oriented code, visual code, and the like. Embodiments may also be at least partly implemented as instructions contained in or on a non-transitory computer-readable medium, which may be read and executed by one or more processors to enable performance of the operations described herein.

The system memory 906 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 8, the system memory 906 can include non-volatile memory 910 and/or volatile memory 912. A basic input/output system (BIOS) can be stored in the non-volatile memory 910.

The computer 902 may include various types of computer-readable storage media in the form of one or more lower speed memory units, including an internal (or external) hard disk drive (HDD) 914, a magnetic floppy disk drive (FDD) 916 to read from or write to a removable magnetic disk 918, and an optical disk drive 920 to read from or write to a removable optical disk 922 (e.g., a CD-ROM or DVD). The HDD 914, FDD 916 and optical disk drive 920 can be connected to the system bus 908 by a HDD interface 924, an FDD interface 926 and an optical drive interface 928, respectively. The HDD interface 924 for external drive implementations can include at least one or both of Universal Serial Bus (USB) and IEEE 1394 interface technologies.

The drives and associated computer-readable media provide volatile and/or nonvolatile storage of data, data structures, computer-executable instructions, and so forth. For example, a number of program modules can be stored in the drives and memory units 910, 912, including an operating system 930, one or more application programs 932, other program modules 934, and program data 936. In one embodiment, the one or more application programs 932, other program modules 934, and program data 936 can include, for example, the various applications and/or components of the computing devices 102 and 104.

A user can enter commands and information into the computer 902 through one or more wire/wireless input devices, for example, a keyboard 938 and a pointing device, such as a mouse 940. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, track pads, sensors, styluses, and the like. These and other input devices are often connected to the processing unit 904 through an input device interface 942 that is coupled to the system bus 908, but can be connected by other interfaces such as a parallel port, IEEE 1394 serial port, a game port, a USB port, an IR interface, and so forth.

A monitor 944 or other type of display device is also connected to the system bus 908 via an interface, such as a video adaptor 946. The monitor 944 may be internal or external to the computer 902. In addition to the monitor 944, a computer typically includes other peripheral output devices, such as speakers, printers, and so forth.

The computer 902 may operate in a networked environment using logical connections via wire and/or wireless communications to one or more remote computers, such as a remote computer 948. The remote computer 948 can be a workstation, a server computer, a router, a personal computer, portable computer, microprocessor-based entertainment appliance, a peer device or other common network node, and typically includes many or all of the elements described relative to the computer 902, although, for purposes of brevity, only a memory/storage device 950 is illustrated. The logical connections depicted include wire/wireless connectivity to a local area network (LAN) 952 and/or larger networks, for example, a wide area network (WAN) 954. Such LAN and WAN networking environments are commonplace in offices and companies, and facilitate enterprise-wide computer networks, such as intranets, all of which may connect to a global communications network, for example, the Internet.

When used in a LAN networking environment, the computer 902 is connected to the LAN 952 through a wire and/or wireless communication network interface or adaptor 956. The adaptor 956 can facilitate wire and/or wireless communications to the LAN 952, which may also include a wireless access point disposed thereon for communicating with the wireless functionality of the adaptor 956.

When used in a WAN networking environment, the computer 902 can include a modem 958, or is connected to a communications server on the WAN 954, or has other means for establishing communications over the WAN 954, such as by way of the Internet. The modem 958, which can be internal or external and a wire and/or wireless device, connects to the system bus 908 via the input device interface 942. In a networked environment, program modules depicted relative to the computer 902, or portions thereof, can be stored in the remote memory/storage device 950. It will be appreciated that the network connections shown are exemplary and other means of establishing a communications link between the computers can be used.

The computer 902 is operable to communicate with wire and wireless devices or entities using the IEEE 902 family of standards, such as wireless devices operatively disposed in wireless communication (e.g., IEEE 902.11 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 902.11x (a, b, g, n, etc.) to provide secure, reliable, fast wireless connectivity. A Wi-Fi network can be used to connect computers to each other, to the Internet, and to wire networks (which use IEEE 902.3-related media and functions).

The various elements of the system and devices as previously described with reference to FIGS. 1-9 may include various hardware elements, software elements, or a combination of both. Examples of hardware elements may include devices, logic devices, components, processors, microprocessors, circuits, processors, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. However, determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

The detailed disclosure now turns to providing examples that pertain to further embodiments. Examples one through twenty-nine (1-29) provided below are intended to be exemplary and non-limiting.

In a first example, a system, device, controller, or an apparatus having an enclosure defining an enclosed cavity, a phase change material disposed within the cavity, the phase change material operative to absorb thermal energy and change from an initial state of matter to a secondary state of matter in response to absorption of the thermal energy, and a thermal conductive material thermally coupled with the phase change material, the thermal conductive material operative to transfer the thermal energy from the phase change material to a thermoelectric component.

In a second example and in furtherance of the first example, a system, device, controller, or an apparatus may include the thermoelectric component to convert the thermal energy into electrical energy and either store the electrical energy in a battery component or provide the electrical energy to power at least one component.

In a third example and in furtherance of any of the previous examples, a system, device, controller, or an apparatus may include a printed circuit board including one or more components coupled by one or more traces, the one or more traces comprised of the thermal conductive material.

In a fourth example and in furtherance of any of the previous examples, a system, device, controller, or an apparatus may include the one or more components comprising at least one of a processing component, a memory component, a battery component, and the thermoelectric component.

In a fifth example and in furtherance of any of the previous examples, a system, device, controller, or an apparatus may include the printed circuit board located within the cavity and at least a portion of the one or more components surrounded by the phase change material, the phase change material operative to absorb thermal energy generated by the one or more components.

In a sixth example and in furtherance of any of the previous examples, a system, device, controller, or an apparatus may include the enclosure forming a housing to house the printed circuit board, the phase change material, and the thermal conductive material.

In a seventh example and in furtherance of any of the previous examples, a system, device, controller, or an apparatus may include the thermal conductive material operative to transfer thermal energy from a source to the phase change material.

In an eighth example and in furtherance of any of the previous examples, a system, device, controller, or an apparatus may include the enclosure comprising an insulation portion and the thermal conductive material comprising a graphite material or a silicon material.

In a ninth example and in furtherance of any of the previous examples, a system, device, controller, or an apparatus may include the enclosure forming at least a portion of a watch band or a portion of a frame of a pair of glasses.

In a tenth example and in furtherance of any of the previous examples, a system, device, controller, or an apparatus may include the enclosure comprising an insulation portion, the thermal conductive material surrounded by the phase change material.

In an eleventh example and in furtherance of any of the previous examples, a system, device, controller, or an apparatus may include the enclosure forming at least a portion of a mug.

In a twelfth example and in furtherance of any of the previous examples, a method may include receiving, by a phase change material, thermal energy from a source, changing, by the phase change material, from an initial state of matter to a secondary state of matter in response to absorption of the thermal energy, transferring, by a thermal conductive material coupled with the phase change material, the thermal energy from the phase change material to a thermoelectric component, and converting, by the thermoelectric component, the thermal energy into electrical energy for use in powering one or more electronic components.

In a thirteenth example and in furtherance of any of the previous examples, a method may include providing, by the thermoelectric component, the electrical energy to one or more electronic components to power at least one of the one or more electronic components.

In a fourteenth example and in furtherance of any of the previous examples, a method may include providing, by the thermoelectric component, the electrical energy to a battery component, and storing, by the battery component, the electrical energy to supply power to one or more other electronic components.

In a fifteenth example and in furtherance of any of the previous examples, a method may include providing, by the thermoelectric component, the electrical energy to one or more induction coils and transferring, by the one or more induction coils, the electrical energy to a coupled device.

In a sixteenth example and in furtherance of any of the previous examples, a method may include changing, by the phase change material, from the secondary state to the initial state in response to releasing the thermal energy to the thermal conductive material.

In a seventeenth example and in furtherance of any of the previous examples, a method may include surrounding at least a portion of one or more electronic components with the phase change material such that the phase change material absorbs thermal energy generated by the one or more electronic components.

In an eighteenth example and in furtherance of any of the previous examples, a method may include disposing at least one of the one or more electronic components, the phase change material, and the thermal conductive material within an enclosure.

In a nineteenth example and in furtherance of any of the previous examples, a method may include wherein the enclosure forms one of at least a portion of a watch band, a frame of a pair of glasses, a portion of a mug, or a housing to store the one or more electronic components.

In a twentieth example and in furtherance of any of the previous examples, a system, device, controller, or an apparatus may include a printed circuit board comprising one or more electronic components, a thermoelectric component to convert thermal energy to electrical energy, a phase change material to absorb thermal energy and change from an initial state of matter to a secondary state of matter in response to absorption of the thermal energy, a thermal conductive material thermally coupled with the phase change material and the thermoelectric component, the thermal conductive material to transfer the thermal energy from the phase change material to the thermoelectric component.

In a twenty-first example and in furtherance of any of the previous examples, a system, device, controller, or an apparatus may include the printed circuit board comprising the thermoelectric component, and the thermoelectric component to store the electrical energy in a battery component or provide the electrical energy to power at least one of the one or more electronic components.

In a twenty-second example and in furtherance of any of the previous examples, a system, device, controller, or an apparatus may include the one or more electronic components comprising at least one of a processing component, a memory component, a battery component, and the thermoelectric component.

In a twenty-third example and in furtherance of any of the previous examples, a system, device, controller, or an apparatus may include an enclosure defining a cavity wherein at least one of the printed circuit board, the phase change material, the thermal conductive material, and the thermoelectric component is disposed within the cavity.

In a twenty-fourth example and in furtherance of any of the previous examples, a system, device, controller, or an apparatus may include the one or more electronic components are coupled by one or more traces on the printed circuit board, the one or more traces operate as the thermal conductive material to transfer the thermal energy to the thermoelectric component.

In a twenty-fifth example and in furtherance of any of the previous examples, a system, device, controller, or an apparatus may include wherein the enclosure forms one of at least a portion of a watch band, a frame of a pair of glasses, a portion of a mug, or a computer housing.

In a twenty-sixth example and in furtherance of any of the previous examples, a system, device, controller, or an apparatus may include the initial state of matter comprising a solid state and the secondary state of matter comprising a liquid state.

In a twenty-seventh example and in furtherance of any of the previous examples, a system, device, controller, or an apparatus may include the initial state of matter comprising a liquid state and the secondary state of matter comprising a gaseous state.

In a twenty-eighth example and in furtherance of any of the previous examples, may method may include the initial state of matter comprising a liquid state and the secondary state of matter comprising a gaseous state.

In a twenty-ninth example and in furtherance of any of the previous examples, a method may include the initial state of matter comprising a solid state and the secondary state of matter comprising a liquid state.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

What is claimed is:

1. An apparatus, comprising:
   an enclosure defining an enclosed cavity;
   a thermoelectric component arranged to receive thermal energy and to convert the thermal energy to electrical energy;
   one or more components coupled to the thermoelectric component and arranged to receive the electrical energy from the thermoelectric component;
   a phase change material disposed within the enclosed cavity, the phase change material operative to absorb thermal energy and change from an initial state of matter to a secondary state of matter in response to absorption of the thermal energy; and
   one or more traces coupling the thermoelectric component with the one or more components, the one or more traces comprised of a thermal conductive material operative to thermally couple with the phase change material to transfer the absorbed thermal energy from the phase change material to the thermoelectric component and operative to convey the electrical energy from the thermoelectric component to the one or more components.

2. The apparatus of claim 1, comprising a battery coupled to the thermoelectric component, the thermoelectric component to store at least a portion of the electrical energy in the battery.

3. The apparatus of claim 1, comprising:
   a printed circuit board, the one or more components disposed on the printed circuit board.

4. The apparatus of claim 3, the one or more components comprising at least one of a processing component, a memory component, or a battery component.

5. The apparatus of claim 3, the printed circuit board located within the enclosed cavity and at least a portion of the one or more components surrounded by the phase change material, the phase change material operative to absorb thermal energy generated by the one or more components.

6. The apparatus of claim 3, the enclosure forming a housing to house the printed circuit board, the phase change material, and the thermal conductive material.

7. The apparatus of claim 1, comprising a second thermal conductive material operative to transfer thermal energy from a source to the phase change material.

8. The apparatus of claim 7, the enclosure comprising an insulation portion and the second thermal conductive material comprising a graphite material or a silicon material.

9. The apparatus of claim 8, the enclosure forming at least a portion of a watch band or a portion of a frame of a pair of glasses.

10. The apparatus of claim 1, the enclosure comprising an insulation portion, the thermal conductive material surrounded by the phase change material.

11. The apparatus of claim 10, the enclosure forming at least a portion of a mug.

12. A method, comprising:
    receiving, by a phase change material, thermal energy from a source;
    changing, by the phase change material, from an initial state of matter to a secondary state of matter in response to absorption of the thermal energy;
    transferring, by one or more traces comprised of a thermal conductive material, the thermal energy from the phase change material to a thermoelectric component;
    converting, by the thermoelectric component, the thermal energy into electrical energy for use in powering one or more electronic components; and
    conveying the electrical energy to the one or more electronic components via the one or more traces.

13. The method of claim 12, at least one of the one or more electronic components comprising a battery, the method comprising:
    storing, by the battery component, the electrical energy to supply power to one or more other electronic components.

14. The method of claim 12, comprising:
    providing, by the thermoelectric component, the electrical energy to one or more induction coils; and
    transferring, by the one or more induction coils, the electrical energy to a coupled device.

15. The method of claim 12, comprising:
    changing, by the phase change material, from the secondary state to the initial state in response to releasing the thermal energy to the thermal conductive material.

16. The method of claim 12, comprising:
surrounding at least a portion of one or more electronic components with the phase change material such that the phase change material absorbs thermal energy generated by the one or more electronic components.

17. The method of claim 16, comprising:
disposing at least one of the one or more electronic components, the phase change material, and the thermal conductive material within an enclosure.

18. The method of claim 17, wherein the enclosure forms one of at least a portion of a watch band, a frame of a pair of glasses, a portion of a mug, or a housing to store the one or more electronic components.

19. A system, comprising:
a printed circuit board comprising one or more electronic components;
a thermoelectric component arranged to receive thermal energy and to convert the thermal energy to electrical energy;
a phase change material to absorb thermal energy and change from an initial state of matter to a secondary state of matter in response to absorption of the thermal energy;
one or more traces coupling the thermoelectric component with the one or more components, the one or more traces comprised of a thermal conductive material operative to thermally couple with the phase change material to transfer the absorbed thermal energy from the phase change material to the thermoelectric component and operative to convey the electrical energy from the thermoelectric component to the one or more components.

20. The system of claim 19, the printed circuit board comprising the thermoelectric component, and the thermoelectric component to store at least part of the electrical energy in a battery.

21. The system of claim 19, the one or more electronic components comprising at least one of a processing component, a memory component, or a battery component, and the thermoelectric component.

22. The system of claim 19, comprising:
an enclosure defining a cavity wherein at least one of the printed circuit board, the phase change material, the thermal conductive material, and the thermoelectric component is disposed within the cavity.

23. The system of claim 22, wherein the enclosure forms one of at least a portion of a watch band, a frame of a pair of glasses, a portion of a mug, or a computer housing.

* * * * *